United States Patent
Hase et al.

(10) Patent No.: US 9,991,314 B2
(45) Date of Patent: Jun. 5, 2018

(54) MAGNETORESISTIVE ELEMENT AND MAGNETIC MEMORY

(71) Applicant: Kabushiki Kaisha Toshiba, Minato-ku (JP)

(72) Inventors: Naoki Hase, Shinagawa (JP); Tadaomi Daibou, Yokohama (JP); Yushi Kato, Chofu (JP); Shumpei Omine, Meguro (JP); Junichi Ito, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 19 days.

(21) Appl. No.: 15/262,117

(22) Filed: Sep. 12, 2016

(65) Prior Publication Data

US 2016/0380029 A1 Dec. 29, 2016

Related U.S. Application Data

(63) Continuation of application No. PCT/JP2015/066474, filed on Jun. 8, 2015.

(30) Foreign Application Priority Data

Sep. 19, 2014 (JP) .................. 2014-191669

(51) Int. Cl.
*H01L 43/02* (2006.01)
*H01L 27/22* (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC ......... H01L 43/02; H01L 43/04; H01L 43/08; H01L 43/10; H01L 43/12
See application file for complete search history.

(56) References Cited

U.S. PATENT DOCUMENTS 8,223,533 B2 7/2012 Ozeki et al.
2005/0040433 A1 2/2005 Nozieres et al.
(Continued)

FOREIGN PATENT DOCUMENTS

JP 2002-56666 A 2/2002
JP 2003-115621 A 4/2003
(Continued)

OTHER PUBLICATIONS

International Search Report dated Aug. 25, 2015 in PCT/JP2015/066474 (with English language translation).
(Continued)

*Primary Examiner* — Cuong Q Nguyen
(74) *Attorney, Agent, or Firm* — Oblon, McClelland, Maier & Neustadt, L.L.P.

(57) ABSTRACT

A magnetoresistive element according to an embodiment includes: a first magnetic layer; a second magnetic layer; and a first nonmagnetic layer disposed between the first magnetic layer and the second magnetic layer, the second magnetic layer containing a material with a composition $(lR_{1-x}hR_x)_z(TM_{1-y}Z_y)_{1-z}$ ($0<x<1$, $0 \le y \le 0.6$, $0.13 \le z \le 0.22$) where lR is at least one element of Y, La, Ce, Pr, Nd, and Sm, hR is at least one element of Eu, Gd, Tb, Dy, Ho, Er, Tm, Yb, or Lu, TM is at least one element of Mn, Fe, Co, or Ni, and Z is at least one element of B, C, Mg, Al, Sc, Ti, Cu, or Zn.

20 Claims, 18 Drawing Sheets

(51) Int. Cl.
*H01L 43/08* (2006.01)
*H01L 43/10* (2006.01)
*H01L 27/105* (2006.01)
*H01L 29/82* (2006.01)
*G11C 11/16* (2006.01)
*H01L 43/12* (2006.01)
*H01F 10/12* (2006.01)
*H01F 10/32* (2006.01)

(52) U.S. Cl.
CPC ........ *G11C 11/1675* (2013.01); *H01F 10/126* (2013.01); *H01F 10/3286* (2013.01); *H01L 27/105* (2013.01); *H01L 29/82* (2013.01); *H01L 43/02* (2013.01); *H01L 43/08* (2013.01); *H01L 43/10* (2013.01); *H01L 43/12* (2013.01); *H01F 10/3272* (2013.01)

(56) References Cited

U.S. PATENT DOCUMENTS

| | | |
|---|---|---|
| 2009/0080238 A1 | 3/2009 | Yoshikawa et al. |
| 2012/0241881 A1* | 9/2012 | Daibou .................. H01L 43/10 257/421 |
| 2013/0299929 A1 | 11/2013 | Watanabe et al. |
| 2014/0084401 A1* | 3/2014 | Kato ....................... H01L 43/08 257/425 |

FOREIGN PATENT DOCUMENTS

| | | |
|---|---|---|
| JP | 2005-503669 A | 2/2005 |
| JP | 2009-81216 A | 4/2009 |
| JP | 2010-126733 A | 6/2010 |
| JP | 2010-232447 A | 10/2010 |
| JP | 2013-235914 A | 11/2013 |

OTHER PUBLICATIONS

E. Lectard, et al., "Saturation magnetization and anisotropy fields in the $Sm(Co_{1-x}Cu_x)_5$ phases," Journal of Applied Physics, vol. 75, No. 10, May 15, 1994, pp. 6277-6279.

Y. Tawara, et al., "Rare Earth Permanent Magnet," Morikita Publisher, (2005), Table 2.2 of p. 49. 1 page total.

R. M. Grechishkin, et al., "Thermoreversible permanent magnets in the quasibinary $GdCo_{5-x}Cu_x$ system," Applied Physics Letters 89, 122505, (2006), pp. 122505-1 to 122505-3.

* cited by examiner

| COERCIVE FORCE Hc (kOe) | 6% OF Co IS REPLACED BY Cu | 18% OF Co IS REPLACED BY Cu | 30% OF Co IS REPLACED BY Cu | 48% OF Co IS REPLACED BY Cu | 54% OF Co IS REPLACED BY Cu |
|---|---|---|---|---|---|
| 10% OF Sm IS REPLACED BY Gd | 8.6 | 10.5 | 13 | 12.7 | 13.5 |
| 30% OF Sm IS REPLACED BY Gd | 5.3 | 9.7 | 11.6 | 11.6 | 12.4 |
| 50% OF Sm IS REPLACED BY Gd | 5.2 | 10.2 | 10 | 10.4 | 11.8 |
| 70% OF Sm IS REPLACED BY Gd | 5.1 | 8.1 | 8.6 | 9.8 | 12.5 |
| 90% OF Sm IS REPLACED BY Gd | 2.4 | 4.8 | 7 | 12.4 | 14.7 |

FIG. 15

MAGNETORESISTIVE ELEMENT AND MAGNETIC MEMORY

CROSS REFERENCE TO RELATED APPLICATIONS

This application is a continuation of International Application No. PCT/JP2015/066474, filed on Jun. 8, 2015, which is based upon and claims the benefit of priority from the prior Japanese Patent Application No. 2014-191669, filed on Sep. 19, 2014, the entire contents of which are incorporated herein by reference.

FIELD

Embodiments described herein relate generally to magnetoresistive elements and magnetic memories.

BACKGROUND

Magnetic tunnel junction (MTJ) elements serving as magnetoresistive elements have a multilayer structure including a storage layer, in which the magnetization direction is variable, a reference layer, in which the magnetization direction is unchangeable, and an insulating layer disposed between the storage layer and the reference layer. The MTJ elements are known to have a tunneling magnetoresistive (TMR) effect, and used as storage elements of memory cells in magnetic random access memories (MRAMs).

MRAMs store data ("1", "0") based on changes in relative angle between magnetization directions of magnetic layers included in each MTJ element, and are nonvolatile memories. Since the magnetization may be switched in several nanoseconds, data may be written and read at a high speed. Therefore, the MRAMs are highly expected as next-generation high-speed nonvolatile memories. The cell size of the MRAMs may be reduced by employing spin transfer torque magnetization switching, in which the magnetizations are controlled by means of spin polarized currents. The reduction in cell size may lead to an increase in the current density. The increased current density may allow magnetization switching in storage layers to be performed more easily. Therefore, MRAMs with high density and low power consumption may be obtained.

In order to improve the density of nonvolatile memories, the magnetoresistive elements need be highly integrated. However, thermal stability of ferromagnetic materials, which form the magnetoresistive elements, may be degraded if the entire device size is reduced. Therefore, improvement in the magnetic anisotropy and the thermal stability of the ferromagnetic materials is a problem.

In order to solve this problem, attempts have recently been made to produce MRAMs including perpendicular magnetization MTJ elements, in which the magnetizations of the ferromagnetic materials are perpendicular to the film plane. The magnetic materials to form perpendicular magnetization MTJ elements need to have perpendicular magnetic anisotropy. In order to achieve the perpendicular magnetic anisotropy, materials having crystalline magnetic anisotropy or interface magnetic anisotropy are selected. For example, FePt, CoPt, and FePd have strong crystalline magnetic anisotropy. A number of MTJ elements including an MgO tunnel barrier layer and a layer with interface perpendicular magnetic anisotropy, such as a layer of CoFeB, are reported.

An MTJ element includes a storage layer, a reference layer, and a tunnel barrier layer disposed between the storage layer and the reference layer. The storage layer and the reference layer contain magnetic material, and emit a magnetic field to the outside. In a common MTJ element including perpendicular-magnetization storage layer and reference layer, the stray magnetic field from the reference layer is greater than that from a reference layer included in an in-plane magnetization type MTJ element, in which the magnetization of a ferromagnetic material is parallel to the film plane. The storage layer, which has a smaller coercive force than the reference layer, of the perpendicular magnetization type MTJ element is strongly influenced by the stray magnetic field from the reference layer. Specifically, problems such as a shift in magnetic field for magnetization switching, and a degradation in thermal stability of the storage layer may be caused due to the influence of the stray magnetic field from the reference layer.

Countermeasures proposed to reduce the stray magnetic field from the reference layer to the storage layer in a perpendicular magnetization MTJ element include a reduction in saturation magnetization in the reference layer, and an addition of a magnetic layer (shift adjustment layer) with a magnetization that is directed to cancel the magnetization of the reference layer. The reduction in saturation magnetization of the reference layer, however, may lead to degradation in thermal stability of the reference layer itself. The degradation in thermal stability may lead to the switching of the direction of magnetization of the reference layer due to the stray magnetic field from the shift adjustment layer or the storage layer while a temperature is increased during, for example, reflow soldering of the magnetic memory array. As a result, the magnetization direction of the reference layer and the magnetization direction of the shift adjustment layer, which need to act to cancel the stray magnetic fields from these layers, match to apply a greater stray magnetic field to the storage layer.

BRIEF DESCRIPTION OF THE DRAWINGS

FIG. 15 shows the results of the measurement of coercive force when the amount of substitution of Gd for Sm and the amount of substitution of Cu for Co are changed in a $(Sm, Gd)_{17}(Co, Cu)_{83}$ magnetic film.

DETAILED DESCRIPTION

Figure 1:
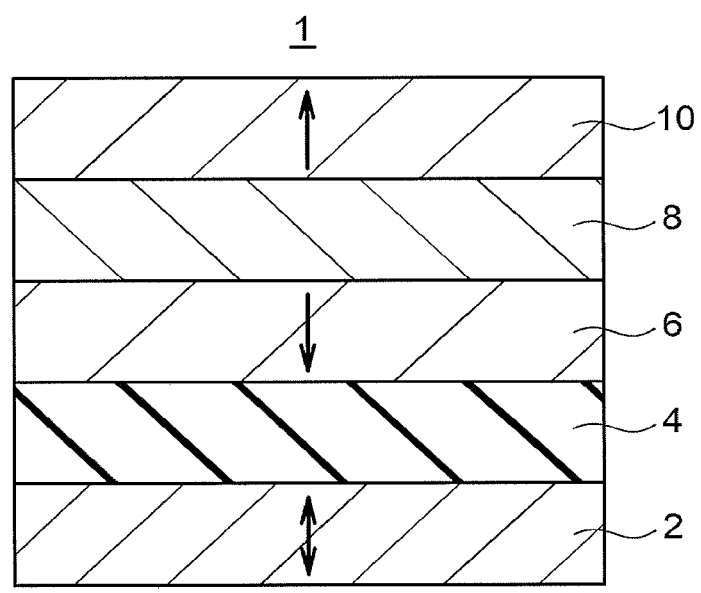
FIG. 1 is a cross-sectional view of a magnetoresistive element according to a first embodiment.

A magnetoresistive element according to an embodiment includes: a first magnetic layer; a second magnetic layer; and a first nonmagnetic layer disposed between the first magnetic layer and the second magnetic layer, the second magnetic layer containing a material with a composition $(IR_{1-x}hR_x)_z(TM_{1-y}Z_y)_{1-z}$ (0<x<1, 0≤y≤0.6, 0.13≤z≤0.22) where IR is at least one element of Y, La, Ce, Pr, Nd, or Sm, hR is at least one element of Eu, Gd, Tb, Dy, Ho, Er, Tm, Yb, or Lu, TM is at least one element of Mn, Fe, Co, or Ni, and Z is at least one element of B, C, Mg, Al, Sc, Ti, Cu, or Zn.

Embodiments will now be described with reference to the accompanying drawings. In the following explanations, elements having the same function and the same structure are denoted by the same reference numeral, and the explanations on the elements will be repeated only when it is necessary to do so.

First Embodiment

FIG. 1 shows a magnetoresistive element according to a first embodiment. The magnetoresistive element 1 according to the first embodiment is an MTJ element including a single pinned layer. The magnetoresistive element 1 has a multilayer structure including a storage layer 2 with a magnetic film, a reference layer 6 with a magnetic film, a nonmagnetic layer 4 disposed between the storage layer 2 and the reference layer 6, a shift adjustment layer 10 with a magnetic layer, disposed on the opposite side of the reference layer 6 to the nonmagnetic layer 4, and an antiferromagnetic coupling layer 8 disposed between the reference layer 6 and the shift adjustment layer 10. Thus, the magnetoresistive element 1 according to the first embodiment has a multilayer structure in which the storage layer 2, the nonmagnetic layer 4, the reference layer 6, the antiferromagnetic coupling layer 8, and the shift adjustment layer 10 are stacked in this order (the multilayer structure shown in FIG. 1, in which the layers are sequentially stacked from the storage layer 2 to the shift adjustment layer 10).

Figure 2:
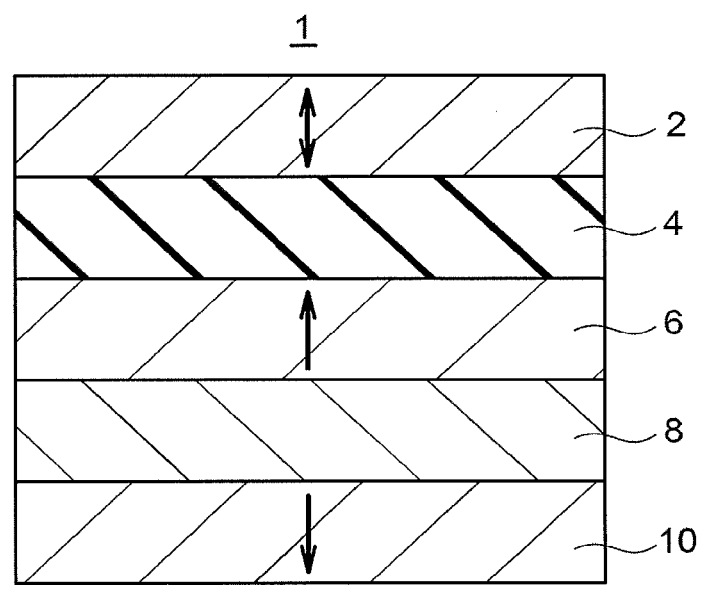
FIG. 2 is a cross-sectional view of a magnetoresistive element according to a modification of the first embodiment.

A multilayer structure in which the shift adjustment layer 10, the antiferromagnetic coupling layer 8, the reference layer 6, the nonmagnetic layer 4, and the storage layer 2 are stacked in this order may also be employed, as in a magnetoresistive element according to a modification of the first embodiment shown in FIG. 2. In the multilayer structure of the modification shown in FIG. 2, the stacking order is opposite to that of the multilayer structure shown in FIG. 1. The storage layer 2, the reference layer 6, and the shift adjustment layer 10 of the magnetoresistive element 1 according to the first embodiment have perpendicular magnetic anisotropy. Thus, the magnetoresistive element 1 according to the first embodiment is a perpendicular magnetization MTJ element, in which the direction of magnetization in each layer is perpendicular to the film plane. The "film plane" herein means the top surface of each layer.

The storage layer 2 is a magnetic layer in which the direction of magnetization may be switched due to the influence of spin-polarized electrons. The storage layer 2 may be formed of a magnetic transition metal or element (Mn, Fe, Co, or Ni), an alloy containing at least one of these magnetic transition elements, or an alloy containing at least one of these magnetic transition elements and at least one nonmagnetic element (for example, at least one element selected from B, Al, Si, Ti, V, Cr, Ga, Ge, or Bi).

The magnetization of the reference layer 6 is opposite to, or antiparallel to that of the shift adjustment layer 10. In the magnetoresistive element 1, if the nonmagnetic layer 4 is of insulating material, for example MgO is used to have a tunnel magnetoresistive (TMR) effect. If the nonmagnetic layer 4 is of a conductive material, one of Cu, Au, Ag, and Al, or an alloy of these materials is used to have a giant magnetoresistive (GMR) effect.

The antiferromagnetic coupling layer 8 disposed between the magnetic layers causes antiferromagnetic interlayer exchange coupling between the magnetic layers. The antiferromagnetic coupling layer 8 is formed of, for example, a metal element selected from Ru, Rh, and Ir, an alloy containing at least one 3d transition element selected from Mn, Cr, or Fe, or an alloy containing at least one of these metal elements and at least one of the transition metal elements. Examples of an alloy containing a 3d transition element include IrMn, PtMn, FeMn, and FeRh. The antiferromagnetic coupling layer 8 may be formed of a single rare earth element (one element selected from Y, La, Ce, Pr, Nd, Sm, Eu, Gd, Tb, Dy, Ho, Er, Tm, Yb, and Lu), or an alloy containing at least one rare earth element and at least one transition metal element (for example, TbCoFe, or GdCo). In other words, the ferromagnetic layer 2 is a magnetic layer containing a least one element of Mn, Al, Ge, or Ga. As used herein, a phrase referring to "at least one of" a list of items refers to any combination of those items, including a single member. As an example, "at least one of: a, b, or c" is intended to cover a, b, c, a-b, a-c, b-c, and a-b-c."

(Write Method)

In the magnetoresistive element according to any of the first embodiment and other embodiments, if the magnetization direction of the storage layer 2 is changed from antiparallel to parallel to the magnetization direction of the reference layer 6, an electron current that flows in a direction opposite to an electric current is caused to flow from the reference layer 6 to the storage layer 2. In this case, electrons passing through the reference layer 6 are spin-polarized. The spin-polarized electrons pass through the nonmagnetic layer 4 and flow into the storage layer 2. The electrons flowing into the storage layer 2 exert spin torque on the magnetization of the storage layer 2 to change the magnetization direction of the storage layer 2 to be parallel to the magnetization direction of the reference layer 6. As a result, the magnetization direction of the storage layer 2 becomes parallel to the magnetization direction of the reference layer 6.

If the magnetization direction of the storage layer 2 is changed from parallel to antiparallel to the magnetization direction of the reference layer 6, an electron current is caused to flow from the storage layer 2 to the reference layer 6. In this case, electrons passing through the storage layer 2 are spin-polarized. The spin-polarized electrons pass through the nonmagnetic layer 4 and flow toward the reference layer 6. The spin-polarized electrons having spin that is in the same direction as the magnetization direction of the reference layer 6 pass through the reference layer 6. However, electrons having spin in the opposite direction to the magnetization direction of the reference layer 6 are reflected at the interface between the nonmagnetic layer 4 and the reference layer 6, and pass through the nonmagnetic layer 4 to flow into the storage layer 2. The electrons flowing into the storage layer 2 exert spin torque on the magnetization of the storage layer 2 to change the magnetization direction of the storage layer 2 to be antiparallel to the magnetization direction of the reference layer 6. As a result, the magnetization direction of the storage layer 2 becomes antiparallel to the magnetization direction of the reference layer 6.

(Read Method)

In a read operation, a read current is caused to flow from one of the storage layer 2 and the reference layer 6 to the other, and a voltage or a current across the magnetoresistive element 1 is measured to determine whether the magnetization direction of the storage layer 2 is parallel or antiparallel to the magnetization direction of the reference layer 6. If the magnetization direction is parallel, the electric resistance across the magnetoresistive element 1 is relatively low, and if the magnetization direction is antiparallel, the electric resistance across the magnetoresistive element 1 becomes relatively high.

Second Embodiment

Figure 3:
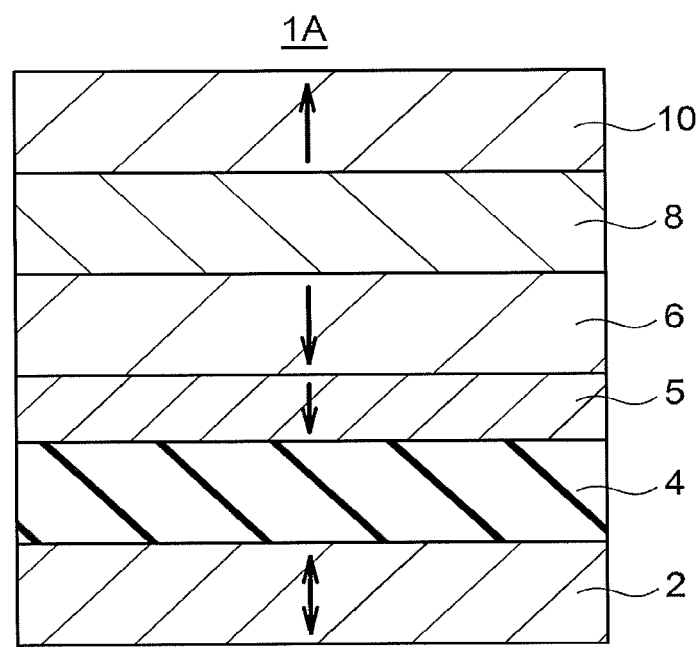
FIG. 3 is a cross-sectional view of a magnetoresistive element according to a second embodiment.

FIG. 3 shows a magnetoresistive element according to a second embodiment. The magnetoresistive element 1A according to the second embodiment has a structure in which a magnetic interface layer 5 is disposed between the nonmagnetic layer 4 and the reference layer 6 in the magnetoresistive element 1 according to the first embodiment shown in FIG. 1. The insertion of the magnetic interface layer 5 causes a sufficiently great TMR effect in the magnetoresistive element 1A. The magnetic interface layer 5 has perpendicular magnetic anisotropy, and therefore the direction of magnetization of the magnetic interface layer 5 is perpendicular to the film plane and the same as that of the reference layer 6.

The magnetic interface layer 5 is formed of an alloy of a magnetic transition metal element (Mn, Fe, Co, or Ni), a compound of at least one of these magnetic transition metal elements and boron (B) (for example, FeB or CoFeB), or a Heusler alloy containing at least one of the magnetic transition metal elements and at least one nonmagnetic metal element (Al, Si, Ti, V, Cr, Ga, or Ge).

In the magnetoresistive element 1A according to the second embodiment shown in FIG. 3, the storage layer 2, the nonmagnetic layer 4, the magnetic interface layer 5, the reference layer 6, the antiferromagnetic coupling layer 8, and the shift adjustment layer 10 are stacked in this order. However, the stacking order may be reversed as in the modification of the first embodiment. Thus, the shift adjustment layer 10, the antiferromagnetic coupling layer 8, the reference layer 6, the magnetic interface layer 5, the nonmagnetic layer 4, and the storage layer 2 may be stacked in this order.

Third Embodiment

Figure 4:
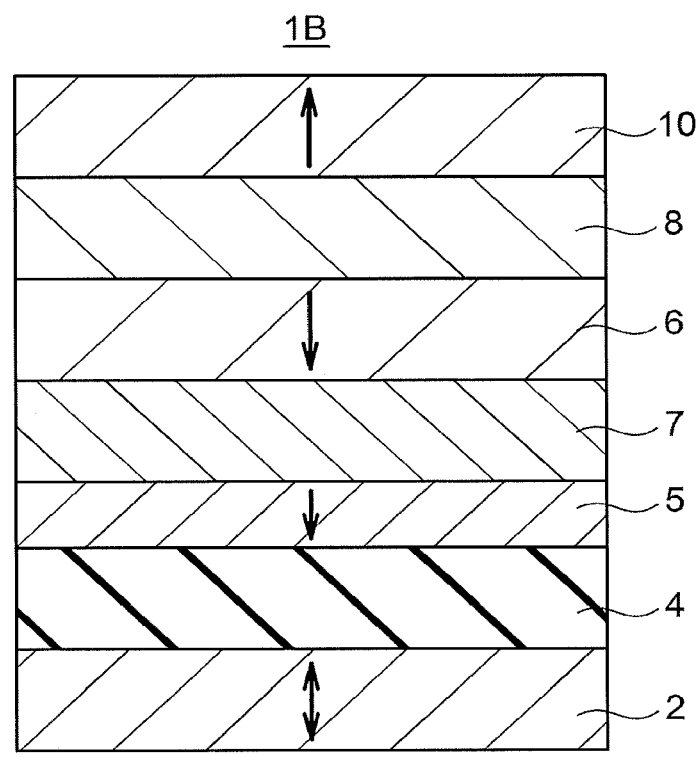
FIG. 4 is a cross-sectional view of a magnetoresistive element according to a third embodiment.

FIG. 4 shows a magnetoresistive element according to a third embodiment. The magnetoresistive element 1B according to the third embodiment has a structure in which a function layer 7 is disposed between the magnetic interface layer 5 and the reference layer 6 in the magnetoresistive element 1A according to the second embodiment shown in FIG. 3. The insertion of the function layer 7 has the following advantages: 1) degradation in the TMR effect caused by interdiffusion of the constituent elements of the magnetic interface layer 5 and the reference layer 6 during deposition of layers disposed above the magnetic interface layer 5 may be suppressed, and 2) the growth of ordered crystal in the reference layer 6 is not prevented, or rather accelerated when the crystal structure differs between the magnetic interface layer 5 and the reference layer 6. The function layer 7 contains an element having a high melting point and being difficult to crystallize, such as Mo, Ta, and W, or an element having a face-centered cubic structure (for example, at least one of Al, Ni, Cu, Rh, Ir, or Pt), or an element having a hexagonal structure (for example, at least one of Mg, Sc, Co, Zr, Ru, Hf, or Zn).

If the element having a high melting point and being difficult to crystallize is used, the function layer 7 may have an amorphous or microcrystal structure. Accordingly, the function layer 7 has an advantage that the crystal structure of the magnetic interface layer 5 and the layers beneath the interface 5 does not hinder the growth of the reference layer 6 and the layers above the reference layer 6.

Since the magnetic film included in the reference layer 6 has a hexagonal crystal structure, the growth of ordered crystal in the magnetic layer may be accelerated if the function layer 7 has a face-centered cubic or hexagonal crystal structure. If the face-centered cubic structure has a (111) preferred orientation, the atom positions form triangles on this surface. The shape of the atom positions matches that of the hexagon of the (0001) preferred orientation of the hexagonal structure. Accordingly, the ordered crystalline state of the magnetic layers above the function layer 7 may be improved.

In the magnetoresistive element 1B according to the third embodiment shown in FIG. 4, the storage layer 2, the nonmagnetic layer 4, the magnetic interface layer 5, the function layer 7, the reference layer 6, the antiferromagnetic coupling layer 8, and the shift adjustment layer 10 are stacked in this order. However, the stacking order may be reversed as in the modification of the first embodiment. Therefore, the shift adjustment layer 10, the antiferromagnetic coupling layer 8, the reference layer 6, the function layer 7, the magnetic interface layer 5, the nonmagnetic layer 4, and the storage layer 2 may be stacked in this order.

Fourth Embodiment

Figure 5:
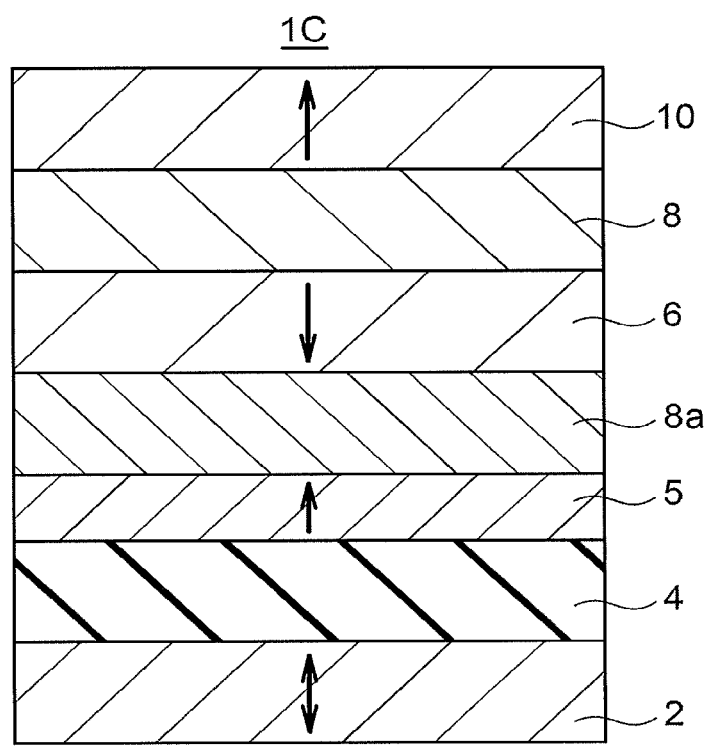
FIG. 5 is a cross-sectional view of a magnetoresistive element according to a fourth embodiment.

FIG. 5 shows a magnetoresistive element according to a fourth embodiment. The magnetoresistive element 1C according to the fourth embodiment has a structure in which an antiferromagnetic coupling layer 8a, instead of the function layer 7, is disposed between the magnetic interface layer 5 and the reference layer 6 in the magnetoresistive element 1B according to the third embodiment shown in FIG. 4. The antiferromagnetic layer 8a couples the magnetizations of the magnetic interface layer 5 and the reference layer 6 so as to be antiparallel to each other.

The difference between the stray magnetic field from the magnetic interface layer 5 and the stray magnetic field from the reference layer 6, if any, may be canceled by the shift adjustment layer 10, since the magnetizations of the magnetic interface layer 5 and the reference layer 6 are coupled so as to be antiparallel to each other by the antiferromagnetic coupling layer 8a. This may reduce the stray magnetic field applied to the storage layer 2. Since the stray magnetic field applied to the storage layer 2 may be reduced, the stray magnetic field may be cancelled even if the thickness of the shift adjustment layer 10 is decreased. This is an advantage that may lead to the reduction in the number of processes in manufacturing magnetoresistive elements. The antiferromagnetic coupling layer 8a may be formed of, for example, at least one metal element selected from Ru, Rh, and Ir, an alloy containing at least one 3d transition element selected from Mn, Cr, or Fe, or an alloy containing at least one element selected from Ru, Rh, or Ir, and at least one of Mn, Cr, or Fe, like the antiferromagnetic coupling layer 8. Examples of an ally containing at least one 3d transition element are IrMn, PtMn, FeMn, or FeRh. The antiferromagnetic coupling layer 8a may also be formed of a single rare earth element (one selected from Y, La, Ce, Pr, Nd, Sm, Eu, Gd, Tb, Dy, Ho, Er, Tm, Yb, or Lu), or an alloy containing at least one rare earth element and at least one transition metal element (for example, TbCoFe, or GdCo).

In the magnetoresistive element 1C according to the fourth embodiment shown in FIG. 5, the storage layer 2, the nonmagnetic layer 4, the magnetic interface layer 5, the antiferromagnetic coupling layer 8a, the reference layer 6, the antiferromagnetic coupling layer 8, and the shift adjustment layer 10 are stacked in this order. However, the stacking order may be reversed as in the modification of the first embodiment. Therefore, the shift adjustment layer 10, the antiferromagnetic coupling layer 8, the reference layer 6, the antiferromagnetic coupling layer 8a, the magnetic interface layer 5, the nonmagnetic layer 4, and the storage layer 2 may stacked in this order.

Fifth Embodiment

Figure 6:
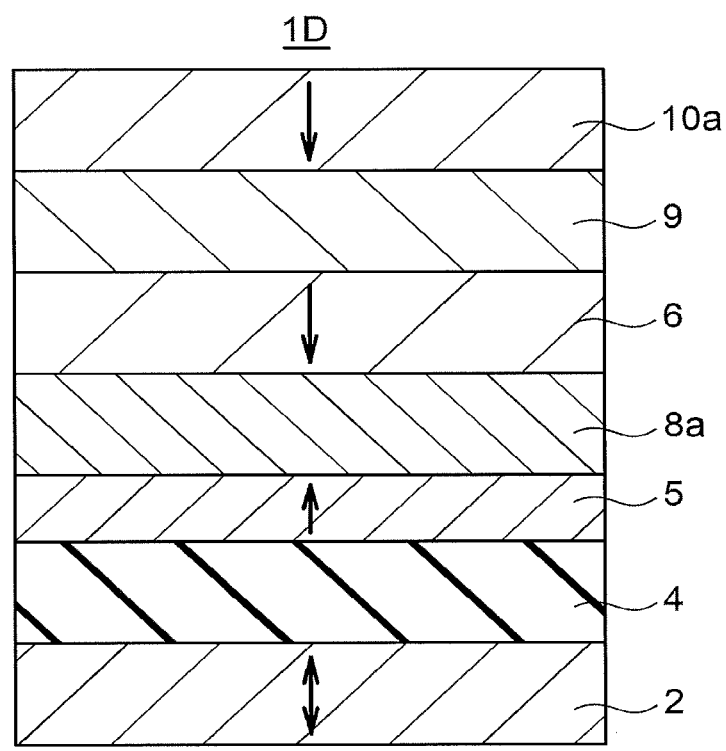
FIG. 6 is a cross-sectional view of a magnetoresistive element according to a fifth embodiment.

FIG. 6 shows a magnetoresistive element according to a fifth embodiment. The magnetoresistive element 1D according to the fifth embodiment has a structure in which a shift adjustment layer 10a, the direction of magnetization of which is the same as that of the reference layer 6, is disposed instead of the shift adjustment layer 10, and an interface layer 9 is disposed instead of the antiferromagnetic coupling layer 8 between the reference layer 6 and the shift adjustment layer 10a in the magnetoresistive element 1C according to the fourth embodiment shown in FIG. 5. The direction of magnetization of the shift adjustment layer 10a is parallel to the direction of magnetization of the reference layer 6 which is disposed below the interface layer 9 that is below the shift adjustment layer 10a, and the direction of magnetization of the shift adjustment layer 10a and the reference layer 6 is antiparallel to the direction of magnetization of the magnetic interface layer 5. Also in this structure, the influence of the difference between the stray magnetic field from the magnetic interface layer 5 and the stray magnetic field from the reference layer 6 may be cancelled by the shift adjustment layer 10a, like the fourth embodiment. If the amount of the stray magnetic field from the magnetic interface layer 5 is greater than the amount of the stray magnetic field from the reference layer 6, the direction of magnetization of the shift adjustment layer 10a and the direction of magnetization of the reference layer 6 caused to be parallel to each other in order to reduce the stray magnetic field applied to the storage layer 2. In this case, the interface layer contains a nonmagnetic material that may not cause antiferromagnetic coupling (for example, Al, Sc, V, Cr, Zn, Ag, Zr, Nb, Mo, Hf, Ta, and W), a metal material having an adjusted thickness so as not to cause antiferromagnetic coupling (for example, Ru, Ir, and Pt), or a nitride (for example, AlN, TiN, and VN).

In the magnetoresistive element 1D according to the fifth embodiment shown in FIG. 6, the storage layer 2, the nonmagnetic layer 4, the magnetic interface layer 5, the antiferromagnetic coupling layer 8a, the reference layer 6, the interface layer 9, and the shift adjustment layer 10a are stacked in this order. However, the stacking order may be reversed as in the modification of the first embodiment. Therefore, the shift adjustment layer 10a, the interface layer 9, the reference layer 6, the antiferromagnetic coupling layer 8a, the magnetic interface layer 5, the nonmagnetic layer 4, and the storage layer 2 may be stacked in this order.

Sixth Embodiment

Figure 7:
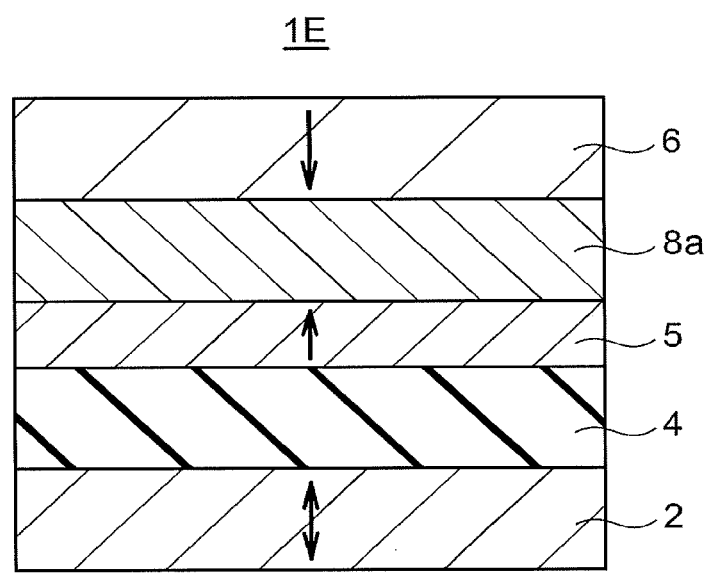
FIG. 7 is a cross-sectional view of a magnetoresistive element according to a sixth embodiment.

FIG. 7 shows a magnetoresistive element according to a sixth embodiment. The magnetoresistive element 1E according to the sixth embodiment has a structure in which the interface layer 9 and the shift adjustment layer 10 are removed from the magnetoresistive element 1D according to the fifth embodiment shown in FIG. 6. In this case, the saturation magnetization is adjusted in the magnetic interface layer 5 and the reference layer 6 so that the magnetization direction of the magnetic interface layer 5 and the magnetization direction of the reference layer 6 become antiparallel to each other to cancel the stray magnetic field. This may eliminate the necessity of the shift adjustment layer 10, and also the interface layer 9.

The magnetoresistive element 1E according to the sixth embodiment may also be obtained by removing the antiferromagnetic coupling layer 8 and the shift adjustment layer 10 from the magnetoresistive element 1C according to the fourth embodiment shown in FIG. 5. The removal of the antiferromagnetic coupling layer 8 or the interface layer 9 and the shift adjustment layer 10 may lead to a considerable reduction in thickness of the produced magnetoresistive element, and thus may contribute to considerable increase in the capacity.

In the magnetoresistive element 1E according to the sixth embodiment shown in FIG. 7, the storage layer 2, the nonmagnetic layer 4, the magnetic interface layer 5, the antiferromagnetic coupling layer 8a, and the reference layer 6 are stacked in this order. However, the stacking order may be reversed as in the modification of the first embodiment. Therefore, the reference layer 6, the antiferromagnetic coupling layer 8a, the magnetic interface layer 5, the nonmagnetic layer 4, and the storage layer 2 may be stacked in this order.

(Magnetic Layer)

The magnetic layers, especially the reference layers, included in the first to sixth embodiments will be described below.

The reference layer included in the magnetoresistive element according to any of the first to sixth embodiments is required not to cause magnetization switching easily, and to have small saturation magnetization. In order not to cause magnetization switching easily, the magnetic layer needs to have a large coercive force and large crystalline magnetic anisotropy. An example of known magnetic materials having the aforementioned characteristics is a rare earth magnetic material containing a rare earth element and at least one magnetic transition metal element selected from Fe or Co (for example, see Yoshio TAWARA et at., "Rare Earth Permanent Magnet," Morikita Publishing Co., Ltd.).

The rare earth magnetic materials, however, generally have large saturation magnetization, and therefore are not suitable for the use in the reference layers of MTJ elements included in MRAMs. The saturation magnetization may be reduced by adding a nonmagnetic element. In this case, however, the magnetic characteristics such as heat resistance may be degraded, and for example the Curie temperature may be decreased (for example, see JOURNAL OF APPLIED PHYSICS 75, 6277, 15 May 1994).

The reference layer of a magnetic memory is required to have a heat resistance that allows the reference layer to resist an increase in temperature caused by a current applied to the MTJ element, and a reflow soldering process performed during the packaging of the magnetic memory. Therefore, a reference layer used in a magnetic memory needs to suppress degradation in magnetic characteristics while the temperature is increased.

The inventors have studied hard to find that a magnetic film having a hexagonal structure containing a light rare earth element, a heavy rare earth element, a magnetic transition metal element, and a nonmagnetic element may be used as a reference layer. The light rare earth element is denoted by "IR," the heavy rare earth element is denoted by "hR," the magnetic transition metal element is denoted by "TM," and the nonmagnetic element is denoted by "Z" herein. The light rare earth element IR is at least one element selected from the group consisting of Y, La, Ce, Pr, Nd, or Sm, the heavy rare earth element hR is at least one element selected from the group consisting of Eu, Gd, Tb, Dy, Ho, Er, Tm, Yb, or Lu, the magnetic transition metal element TM is at least one element selected from the group consisting of Mn, Fe, Co, or Ni, and the nonmagnetic element Z is at least one element selected from the group consisting of B, C, Mg, Al, Sc, Ti, Cu, or Zn.

The existence of the heavy rare earth element hR may reduce the saturation magnetization of the magnetic film since the heavy rare earth is capable of antiferromagnetically coupling with the magnetic transition metal element TM to reduce the saturation magnetization in the magnetic film. This allows both a reduction in saturation magnetization and an improvement in heat resistance (magnetic characteristics during a rise in temperature) of the magnetic characteristics (such as coercive force) to be obtained. The addition of only a nonmagnetic element cannot achieve both of them. Although the saturation magnetization may vary depending on whether the coupling direction of the magnetic moment of rare earth element and the magnetic transition metal element (for example Co) is the same (ferromagnetic coupling) or opposite (antiferromagnetic coupling), the Curie temperature may be substantially the same in both cases (see Yoshio TAWARA et at., "Rare Earth Permanent Magnet," Morikita Publishing Co., Ltd.).

In a reference layer in which a magnetic transition metal element is replaced by a nonmagnetic element, the Curie temperature lowers as the amount of replacement by the nonmagnetic element increases, as described above. This characteristic of the Curie temperature may influence the magnetic characteristics of the magnetic film. Therefore, the dependency of the magnetic characteristics on temperature in the magnetic film as described above may be controlled by the elements contained in the magnetic film. The light rare earth element IR, which is capable of ferromagnetically coupling with the magnetic transition metal element TM, is added to stabilize the hexagonal structure in the crystal of the magnetic film and to improve the effect of having ordered crystal. Since the composition range of Sm in which the hexagonal structure is stably maintained is broader than that of other rare earth elements, as may be understood from phase diagrams, the above effect may be obtained more easily with Sm.

The nonmagnetic element Z is added to not only reduce the saturation magnetization but also increase the coercive force and improve the effect of having ordered crystal in the hexagonal structure in the magnetic film. As described above, the two parameters, the types of rare earth element and the nonmagnetic element Z, in the magnetic film may control not only magnetic characteristics such as saturation magnetization and coercive force, but also the temperature dependency and the ordered crystalline state.

The aforementioned magnetic film is expressed as $(IR_{1-x}hR_x)_z(TM_{1-y}Z_y)_{100-z}$ ($0<x\leq1$, $0\leq y\leq0.6$, $0.13\leq z\leq0.22$). This will be described below. The replacement amount y of the nonmagnetic element Z with respect to the magnetic transition metal element TM (for example Co) is from 0 to 0.6. The reason for this range is that JOURNAL OF APPLIED PHYSICS 75, 6277, 15 May 1994, suggests that if Co is replaced by a nonmagnetic element by 60% or more, the saturation magnetization is substantially lost.

Figure 8:
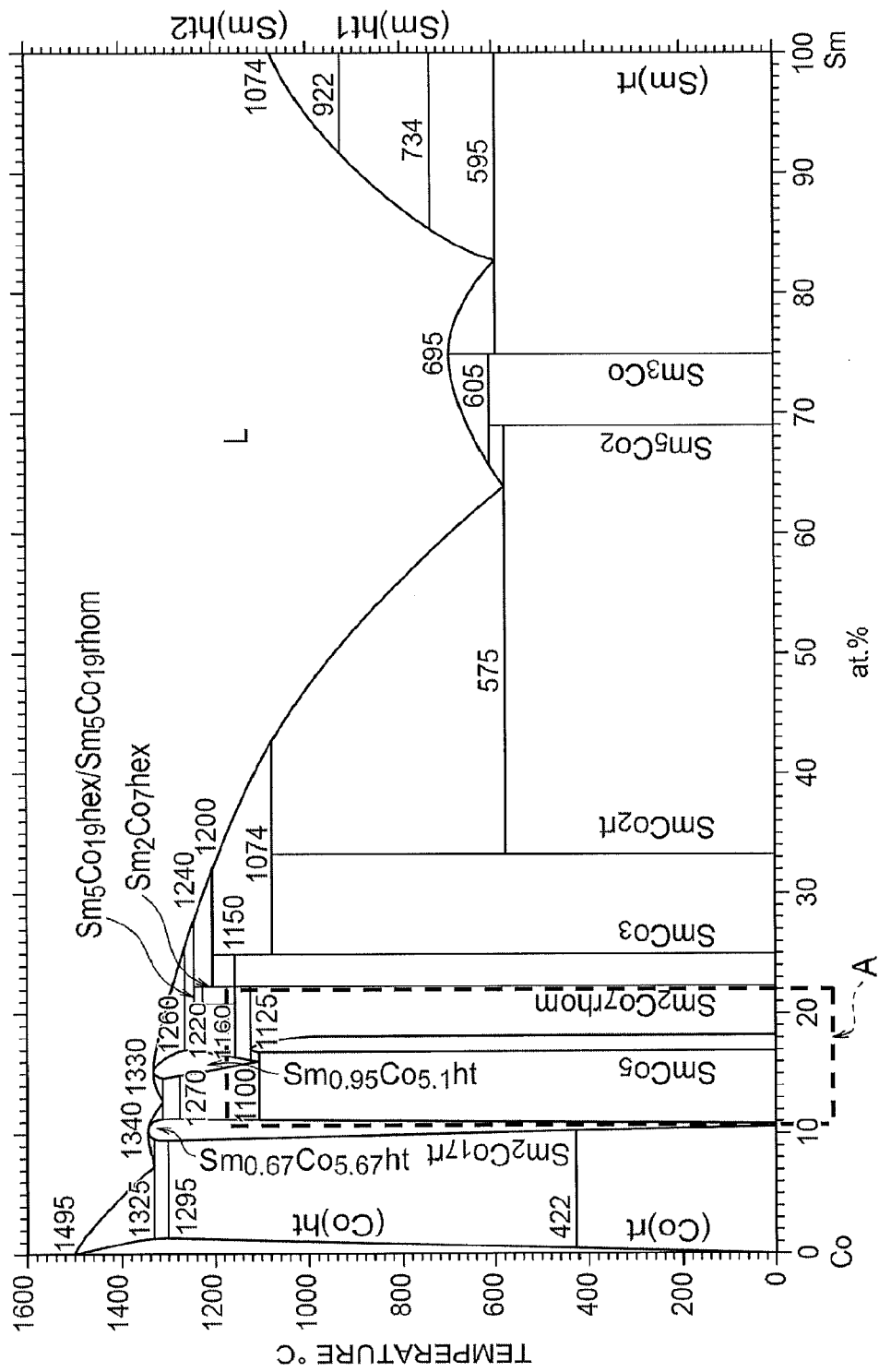
FIG. 8 is a Sm—Co phase diagram.

FIG. 8 is a phase diagram of Sm—Co, which is a typical combination of a rare earth element and a magnetic transition metal element. In FIG. 8, the composition range A surrounded by a broken line, including the single phase $SmCo_5$ having the hexagonal structure or a mixed phase including the $SmCo_5$ phase, corresponds to the range of the atomic percent composition ratio of an alloy of a rare earth element $(IR_{1-x}hR_x)$ having the hexagonal structure, and a magnetic transition metal element TM and a nonmagnetic element Z $(TM_{1-y}Z_y)$. Therefore, the magnetic material phase of the aforementioned magnetic film may be obtained if the composition range of the rare earth element $(IR_{1-x}hR_x)$ is from 11 atom % to 22 atom %, and the composition range of the sum of the magnetic transition metal element TM and the nonmagnetic element Z $(TM_{1-y}Z_y)$ is the rest, 78 atom % to 89 atom %.

Figure 9:
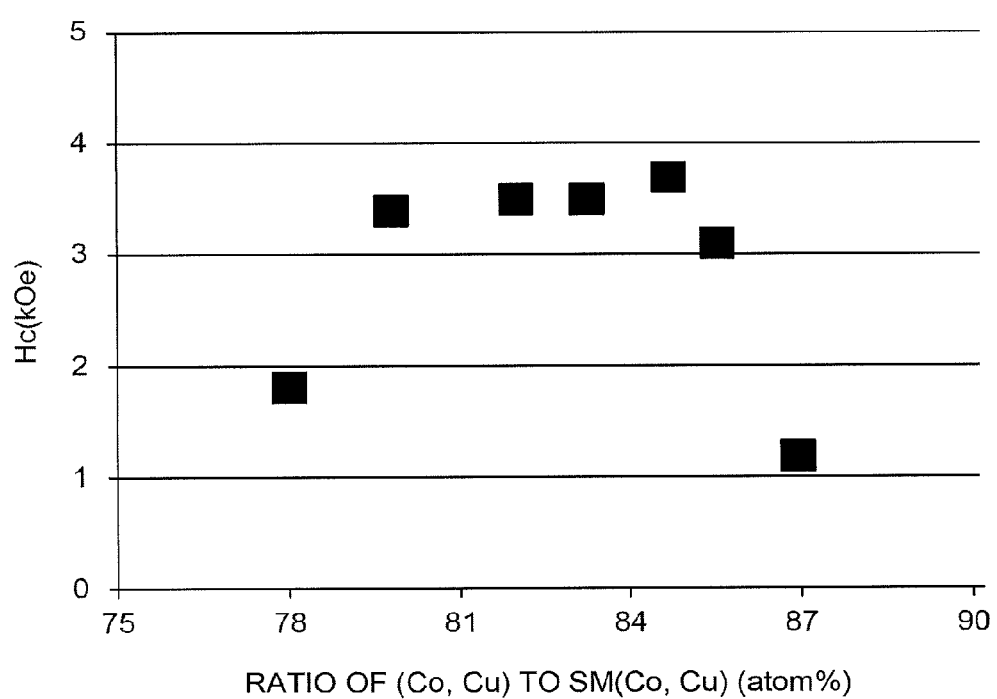
FIG. 9 shows the dependency of coercive force Hc on the (Co, Cu) composition in a Sm(Co, Cu) magnetic film.

FIG. 9 shows the dependency of the coercive force Hc on the ratio of (Co, Cu) in a Sm(Co, Cu) magnetic film disposed on a silicon substrate. If a magnetic material is used to form a reference layer, a high coercive force Hc is required not to cause magnetization switching easily. FIG. 9 shows that if the ratio of (Co, Cu) in total is 78 atom % or less, or 87 atom % or more, the coercive force is considerably degraded. Thus, good magnetic characteristics may be obtained if the ratio of (Co, Cu) in total is 78 atom % or more and 87 atom % or less, and the ratio of the rest, the rare earth element Sm, is 13 atom % or more and 22 atom % or less, which is narrower than the range expected from the phase diagram shown in FIG. 8.

Therefore, the magnetic film is expressed as $(IR_{1-x}hR_x)_z(TM_{1-y}Z_y)_{100-z}$ ($0<x<1$, $0\leq y\leq0.6$, $0.13\leq z\leq0.22$). The reason why there is a difference between the composition range with which good magnetic characteristics may be obtained and the composition range expected from the phase diagram may be that the magnetic characteristics of phases other than the hexagonal structure may become more remarkable in the composition range outside the composition range for obtaining good magnetic characteristics.

The composition ratio of the material of the magnetic film will be described in more detail below.

Figure 10:
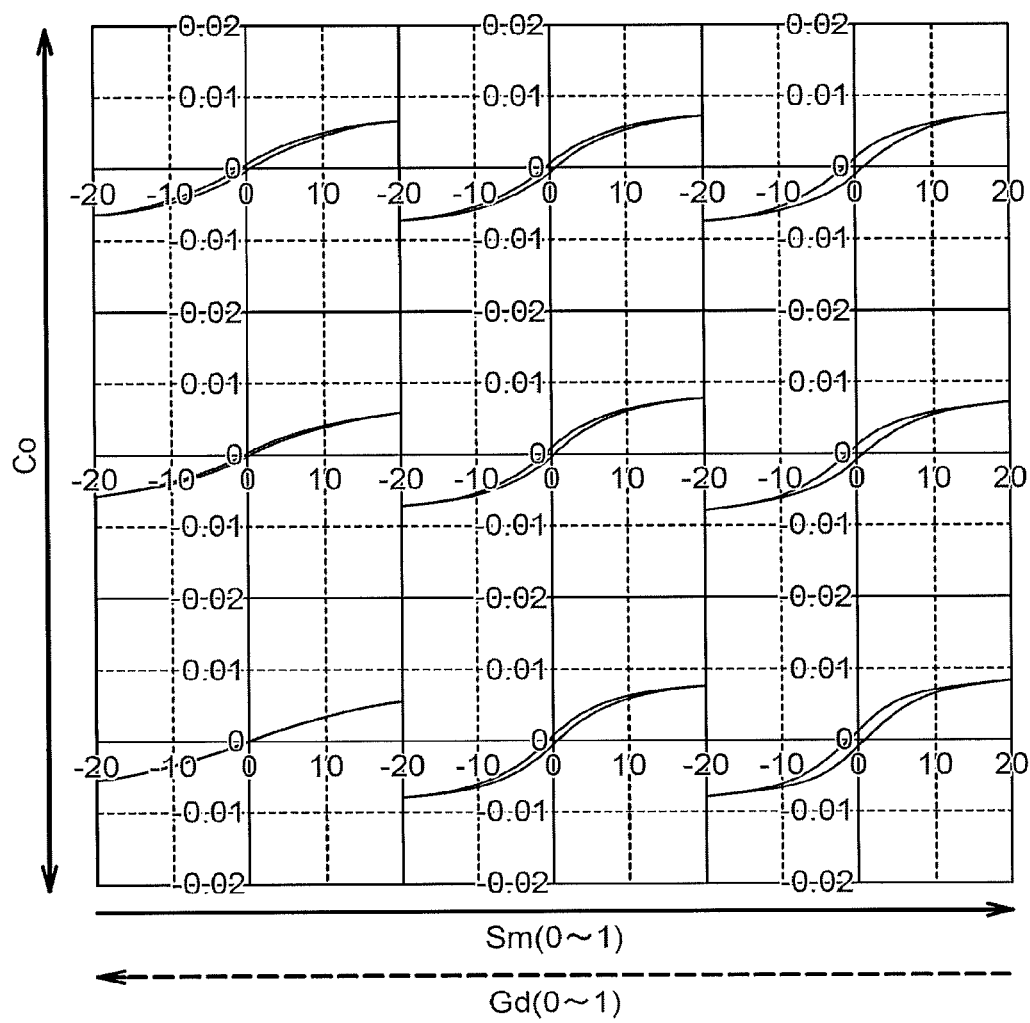
FIG. 10 shows results of measurements of the Kerr effect in $(Sm, Gd)_{17}Co_{83}$ magnetic films.
Figure 11:
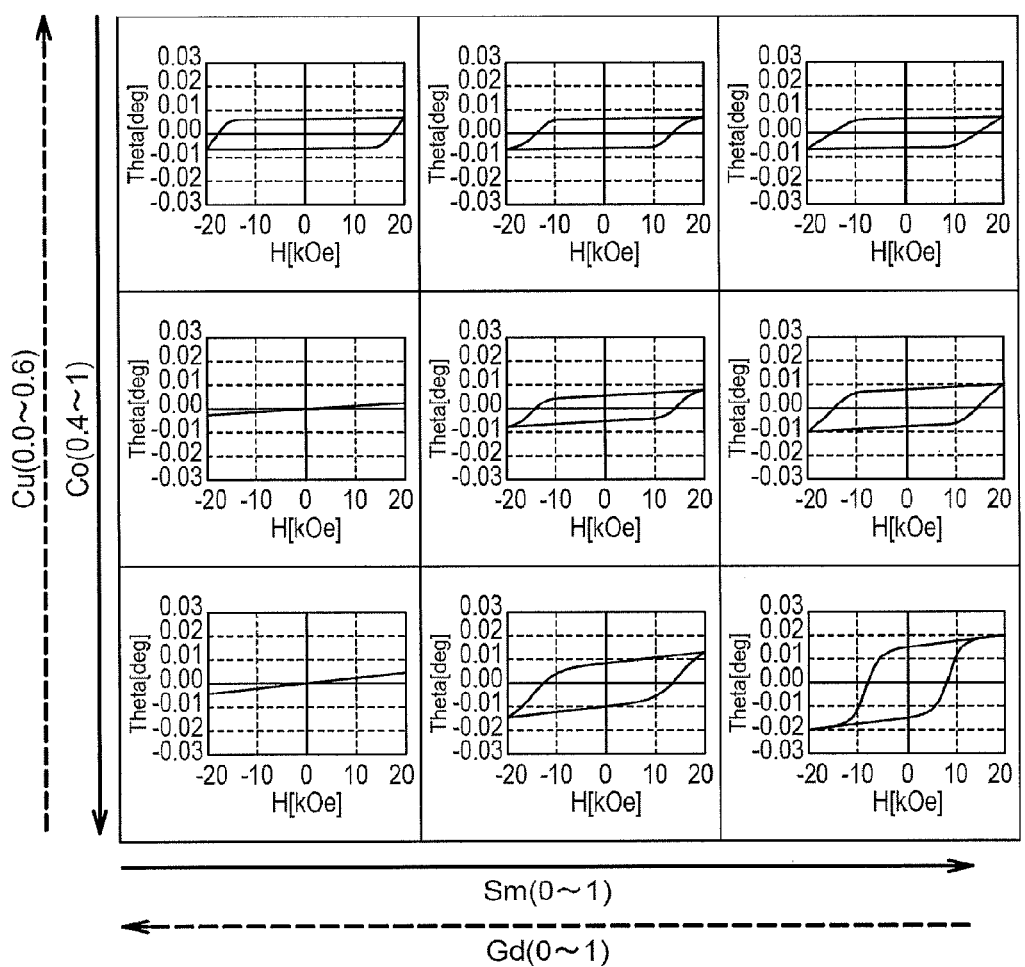
FIG. 11 shows results of measurements of Kerr effect in $(Sm, Gd)_{17}(Co, Cu)_{83}$ magnetic films.

A magnetic film containing Sm as the light rare earth element IR and Gd as the heavy rare earth element hR will be described with reference to FIGS. 10 and 11. FIG. 10 shows a Kerr effect measurement result obtained for nine magnetic film specimens each expressed as $(Sm_{1-x}Gd_x)_{17}(Co_{1-y}Cu_y)_{83}$ (0<x≤1, y=0) and disposed on a sapphire substrate, and FIG. 11 shows a Kerr effect measurement result obtained for nine magnetic film specimens each expressed as $(Sm_{1-x}Gd_x)_{17}(Co_{1-y}Cu_y)_{83}$ (0<x≤1, 0≤y≤0.6) and disposed on a sapphire substrate. In each drawing, the measurement results of the nine specimens are arranged in a 3×3 matrix. In each measurement result, the lateral axis represents external magnetic field, and the longitudinal axis represents magnetization amount. The conditions including the deposition conditions and the thickness for forming the measured magnetic films are the same in each of FIGS. 10 and 11.

The Co concentration is the same for all of the nine specimens, for which the measurement results are arranged in the matrix shown in FIG. 10. The Sm concentration and the Gd concentration in the three specimens arranged horizontally, however, are gradually changed along the solid line arrow for Sm and along the broken line arrow for Gd so that the composition ratio x changes from 0 to 1. The Sm concentration and the Gd concentration in the three specimens arranged horizontally in FIG. 11 are gradually changed along the solid line arrow for Sm and along the broken line arrow for Gd so that the composition ratio x changes from 0 to 1, and the Co concentration and the Cu concentration in the three specimens arranged vertically are gradually changed along the solid line arrow for Co and the broken line arrow for Cu so that the composition ratio y changes from 0 to 0.6.

As can be understood from the measurement results for the magnetic films not including Cu shown in FIG. 10 and the measurement results for the magnetic films including Cu shown in FIG. 11, the difference between magnetization curves becomes wider as the Cu concentration increases. This means that the coercive force for causing magnetization switching of the magnetic film becomes greater. As can be understood from a more detailed study of the measurement results shown in FIG. 11, the coercive force indicated by the magnetization curves increases as the Cu concentration increases. In particular, in a composition range with a higher Gd concentration, the difference between the magnetization curves becomes greater if the Cu concentration is higher. This leads to magnetization of the magnetic film. If the Cu concentration becomes lower, such a difference is not obtained. This means that no magnetization occurs. FIG. 11 also shows that a decrease in the Gd concentration and an increase in the Sm concentration lead to a greater difference between the magnetization curves, and as a result, the magnetic film may be magnetized. This means that perpendicular magnetization may be introduced by increasing the amount of the rare earth element Sm.

Figure 12A:
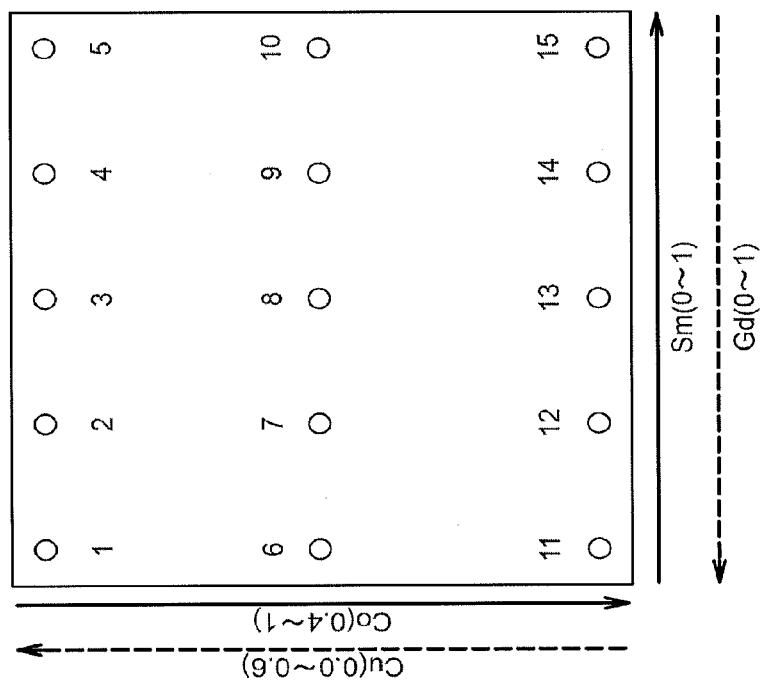
FIG. 12A shows XRD measurement points on a $(Sm, Gd)_{17}(Co, Cu)_{83}$ film plane.
Figure 12B:
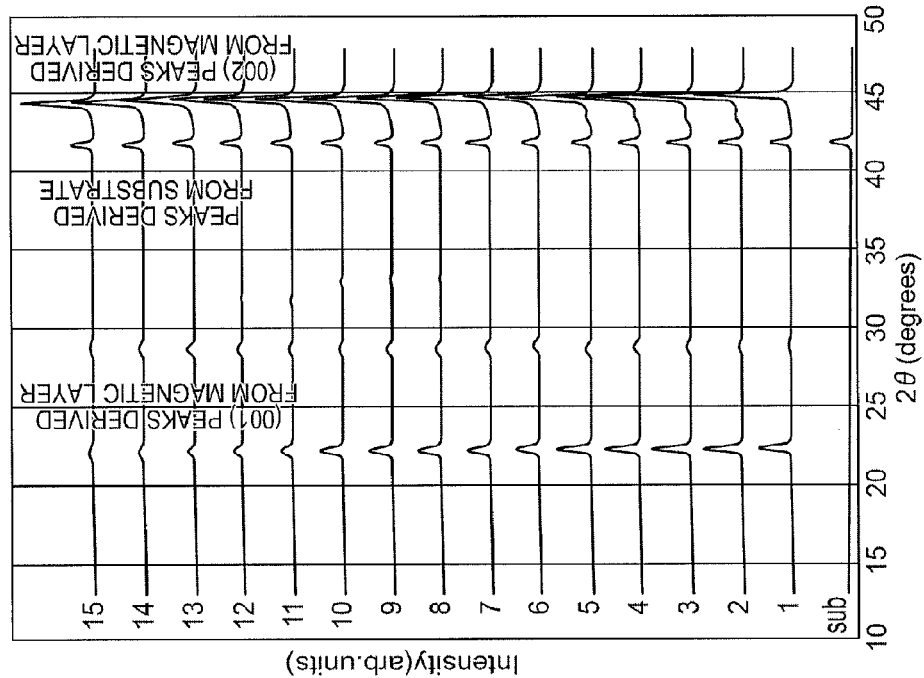
FIG. 12B shows XRD measurement results of $(Sm, Gd)_{17}(Co, Cu)_{83}$ magnetic films representing the measurement points shown in FIG. 12A.

FIGS. 12A and 12B show X-ray diffraction (XRD) measurement results of 15 magnetic film specimens each expressed as $(Sm_{1-x}Gd_x)_{17}(Co_{1-y}Cu_y)_{83}$ (0<x≤1, 0≤y≤0.6). FIG. 12A schematically shows the compositions of the 15 specimens 1 to 15 subjected to the XRD measurements, and FIG. 12B shows the XRD measurement results corresponding to the specimens 1 to 15 shown in FIG. 12A. The lateral axis represents angle and the longitudinal axis represents intensity in the XRD measurement results in FIG. 12B. The peaks around the angles 22° and 45° in the XRD measurement results of the respective specimens shown in FIG. 12B are derived from the magnetic films used, and the peaks around the angle 42° are derived from the substrates on which the magnetic films are disposed.

With respect to the peaks around the angle 22° derived from the magnetic films in the XRD measurement results of the specimens 1 to 15, the peak intensity decreases from the group including the specimens 1 to 5 to the group including the specimens 6 to 10, and then to the group including the specimens 11 to 15, as the Cu concentration decreases. This indicates that as the Cu concentration increases, the ordered crystal state in the magnetic film is improved. Expected magnetic characteristics may be obtained from the magnetic film more easily from the improved ordered crystal state. Therefore, the magnetic film may be magnetized more easily as the Cu concentration increases.

The measurement results shown in FIGS. 10 to 12B indicate that if a magnetic film has layers, in which the concentration of the nonmagnetic element Z such as Cu and the concentration of the light rare earth element IR such as Sm change from a first deposited layer to a last deposited layer, the easiness in forming an ordered crystal state and the intensity of magnetization in the magnetic film may be controlled from the first deposited layer to the last deposited layer.

Figure 13A:
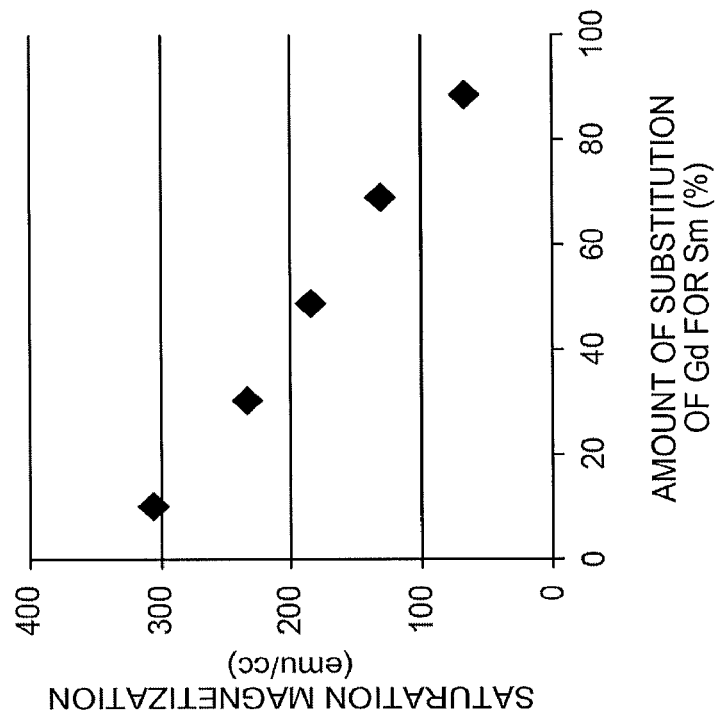
FIG. 13A shows the measurement results relating to the dependency of the saturation magnetization on the amount of substitution of Cu.
Figure 13B:
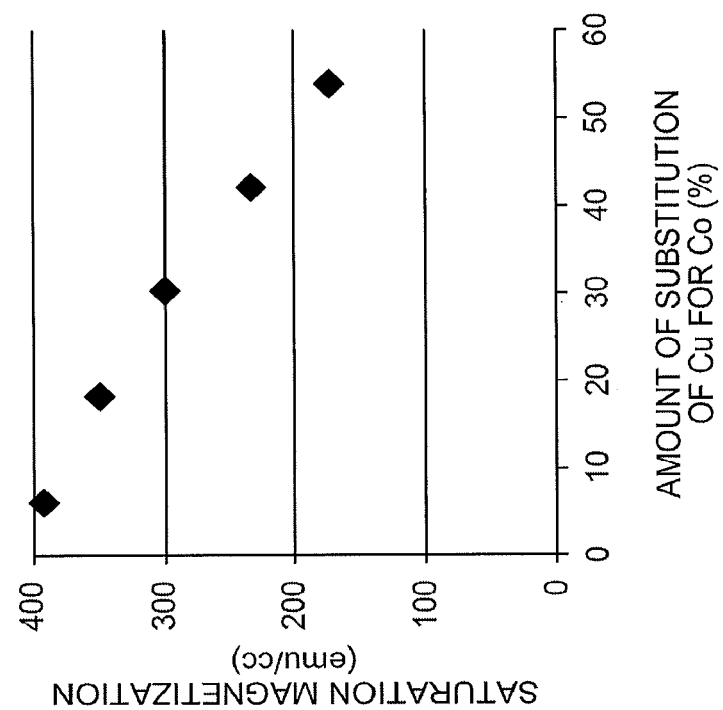
FIG. 13B shows the measurement results relating to the dependency of the saturation magnetization on the amount of substitution of Gd.

FIGS. 13A and 13B show saturation magnetization measurement results of five magnetic film specimens each expressed as $(Sm_{1-x}Gd_x)_{17}(Co_{1-y}Cu_y)_{83}$ (0<x≤1, 0≤y≤0.6). FIG. 13A shows the dependency of the saturation magnetization on the amount of substitution of Cu for Co. The composition ratios of Sm and Gd are fixed. FIG. 13B shows the dependency of the saturation magnetization on the amount of substitution of Gd for Sm. The composition ratios of Co and Cu are fixed. In FIG. 13A, the lateral axis indicates the ratio of substitution of Cu for Co (%), and the longitudinal axis indicates the saturation magnetization (emu/cc). In FIG. 13B, the lateral axis indicates the ratio of substitution of Gd for Sm (%), and the longitudinal axis indicates the saturation magnetization (emu/cc). As can be understood from FIGS. 13A and 13B, the saturation magnetization may be decreased by increasing the amount of substitution of Cu or Gd. Therefore, the magnetic characteristics (saturation magnetization) of the magnetic film may be controlled by using two parameters, the rare earth element and the nonmagnetic element.

Figure 14B:
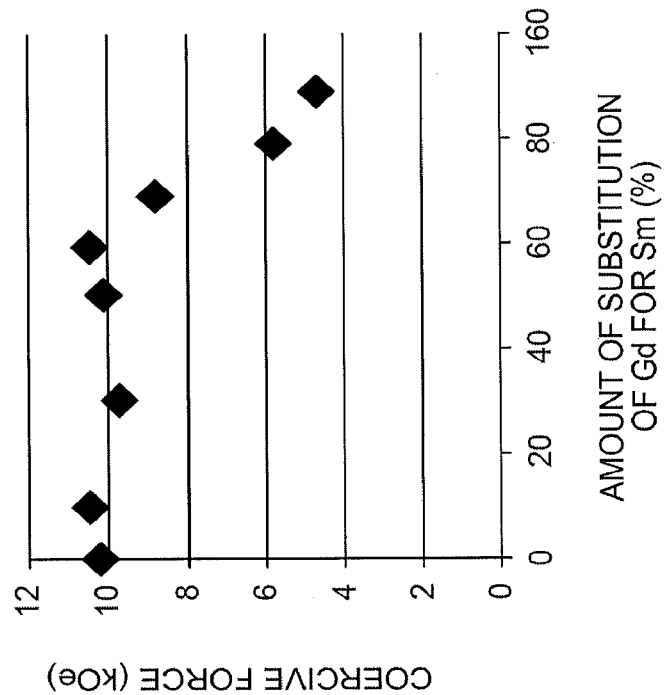
FIG. 14B shows the results of the measurement of coercive force when the amount of substitution of Gd for Sm is changed in a $(Sm, Gd)_{17}(Co, Cu)_{83}$ magnetic film.
Figure 14A:
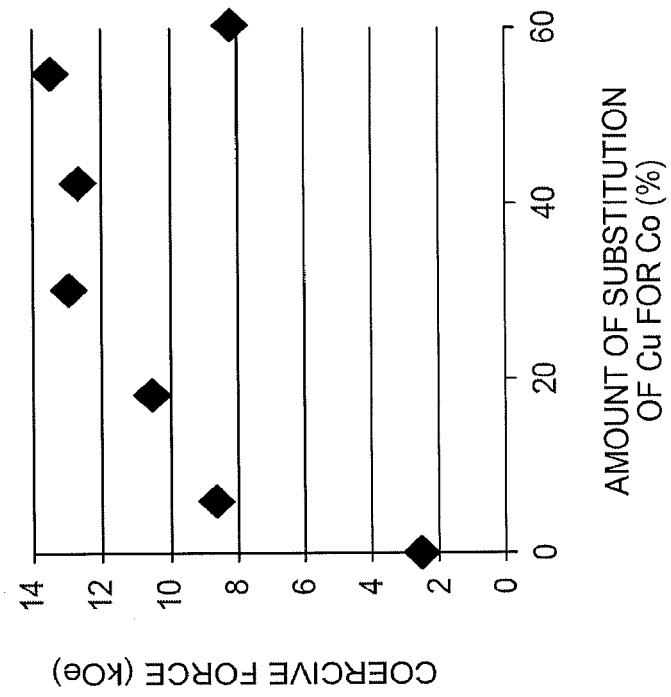
FIG. 14A shows the results of the measurement of coercive force when the amount of substitution of Cu for Co is changed.

FIGS. 14A and 14B show coercive force Hc measurement results for a plurality of magnetic film specimens each expressed as $(Sm_{1-x}Gd_x)_{17}(Co_{1-y}Cu_y)_{83}$ (0<x≤1, 0≤y≤0.6). FIG. 14A shows the dependency of the coercive force on the amount of substitution of Cu for Co. The composition ratios of Sm and Gd are fixed. FIG. 14B shows the dependency of the coercive force on the amount of substitution of Gd for Sm. The composition ratios of Co and Cu are fixed. In FIG. 14A, the lateral axis indicates the ratio of substitution of Cu for Co (%), and the longitudinal axis indicates the coercive force (kOe). In FIG. 14B, the lateral axis indicates the ratio of substitution Gd for Sm (%), and the longitudinal axis indicates the coercive force (kOe).

FIG. 15 is a table compiling the coercive force measurement results in FIGS. 14A and 14B. Each horizontal row in FIG. 15 shows the coercive force measurement results when the amount of substitution of Cu for Co is changed, and each vertical column shows the coercive force measurement results when the amount of substitution of Gd for Sm is changed. The measurement unit of coercive force Hc is kOe. The composition patterns that do not lead to a great coercive force are hatched in FIG. 15. The other patterns that lead to a great coercive force, 8 kOe or more, are not hatched.

The measurement results in FIG. 15 indicate that two parameters, the amount of substitution of Cu and the amount of substitution of Gd, determine a composition range for obtaining a great coercive force. It seems that if the amount of substitution of Cu is 6% or less, the great coercive force may not be obtained easily since the amount of substitution of Cu is too small. Similarly, it seems that if the amount of substitution of Gd is 90% or more, the great coercive force may not be obtained easily since the amount of substitution of Gd is too much. The above results match the results shown in FIGS. 10 to 12B.

The measurement results in FIG. 15 indicate that in order to obtain a great coercive force, the amount of substitution of Cu for Co is preferably 18% or more and 54% or less, and the amount of Gd for Sm is preferably 10% or more and 70% or less. A magnetic film meeting the above composition ratios for obtaining a great coercive force may be expressed as $(IR_{1-x}hR_x)_z(TM_{1-y}Z_y)_{1-z}$ ($0.1 \leq s \leq 0.7$, $0.18 \leq y \leq 0.54$, $0.13 \leq z \leq 0.22$).

Even if the amount of substitution of Cu is 6% or less, a great coercive force may be obtained as long as the amount of substitution of Gd is 10% or less, and even if the amount of substitution of Gd is 90% or more, a great coercive force may be obtained as long as the amount of substitution of Cu is 48% or more.

Figure 16:
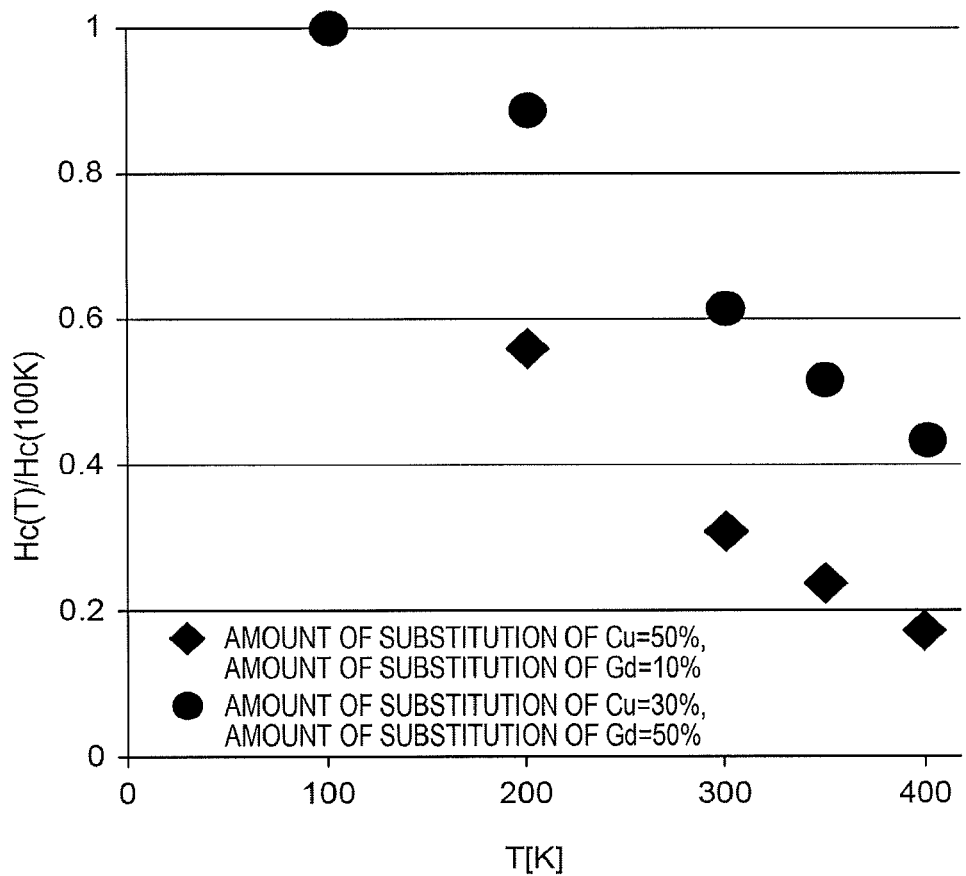
FIG. 16 shows the dependency of coercive force Hc on temperature in $(Sm, Gd)_{17}(Co, Cu)_{83}$ magnetic films.

FIG. 16 shows the dependency of coercive force on temperature in magnetic films that are expressed as $(Sm_{1-x}Gd_x)_{17}(Co_{1-y}Cu_y)_{83}$ ($0<x \leq 1$, $0 \leq y \leq 0.6$). The dependency of coercive force on temperature is measured with respect to the amount of substitution of Cu and the amount of substitution of Gd. In FIG. 16, the lateral axis represents the measurement temperature, and the longitudinal axis represents the coercive force Hc(T) at each measurement temperature point, normalized by the coercive force Hc (100K), which is the coercive force Hc measured at a lowest measurement temperature point, 100K. A specimen in which 50% of Co is replaced by Cu and 10% of Sm is replaced by Gd, and a specimen in which 30% of Co is replaced by Cu and 50% of Sm is replaced by Gd are used in the measurements. The compositions ratios of these specimens correspond to the magnetization curves of the composition pattern with the maximum range of Sm amount and the maximum range of Cu amount, and the magnetization curves of the composition pattern with the intermediate range of Sm amount and the intermediate range of Cu amount. The magnetization curves of these composition patterns indicate that the magnitude of magnetization is equivalent for these two specimens.

FIG. 16 shows that the ratio of a decrease of coercive force to an increase in temperature is lower in the 30%-Cu and 50%-Gd specimen than the 50%-Cu and 10%-Gd specimen. This indicates that, if the saturation magnetization of specimens is substantially the same, a specimen with a high amount of substitution of Gd to lower the saturation magnetization suppress a decrease in coercive force relative to an increase in temperature more effectively than a specimen with a high amount of substitution of Cu to lower the saturation magnetization. This indicates that the dependency of magnetic characteristics on temperature in magnetic films may be controlled by adjusting the substituting elements.

It may be understood from the foregoing that if the reference layer of the magnetoresistive element according to any of the first to sixth embodiments includes a magnetic film that expressed as $(IR_{1-x}hR_x)_z(TM_{1-y}, Z_y)_{100-z}$ ($0<x \leq 1$, $0 \leq y \leq 0.6$, 13 atom % $\leq z \leq$ 22 atom %), the dependency of the magnetic film on temperature may be controlled, as well as the saturation magnetization and the coercive force.

Seventh Embodiment

Figure 17:
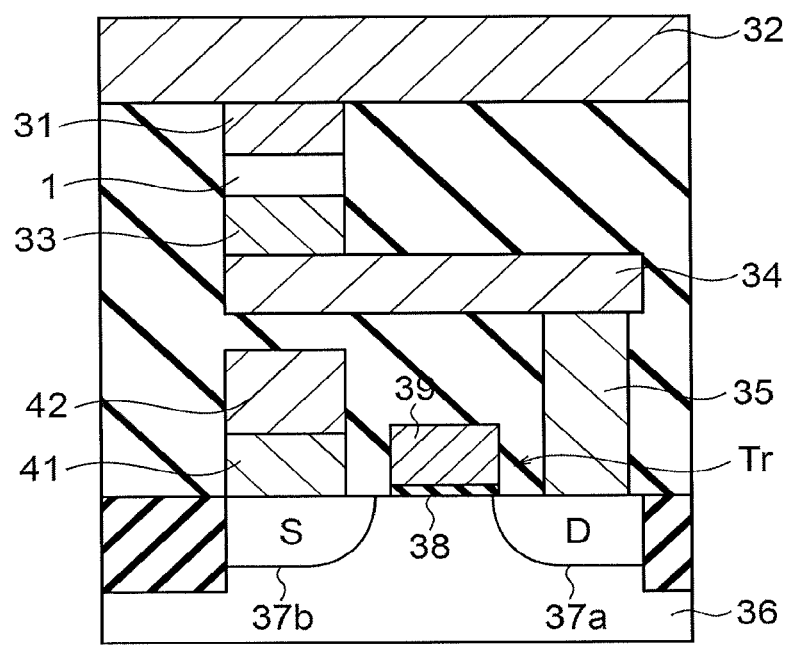
FIG. 17 is a cross-sectional view showing a memory cell of a magnetic memory according to a seventh embodiment.

A magnetic memory according to a seventh embodiment will be described with reference to FIGS. 17 and 18. The magnetic memory according to the seventh embodiment includes at least one memory cell. FIG. 17 shows a cross-sectional view of the memory cell. The memory cell 53 includes a magnetoresistive element (MTJ element) according to any of the first to sixth embodiments as a storage element. In the following descriptions, the memory cell 53 includes the magnetoresistive element 1 according to the first embodiment as a storage element.

As shown in FIG. 17, the top surface of the magnetoresistive element (MTJ element) 1 is connected to a bit line 32 via an upper electrode 31. The lower surface of the MTJ element 1 is connected, via a lower electrode 33, an extraction electrode 34, and a plug 35, to a drain region 37a of source and drain regions formed near the surface of a semiconductor substrate 36. The drain region 37a is included in a selection transistor Tr together with a source region 37b, a gate insulating film 38 disposed on the substrate 36, and a gate electrode 39 disposed on the gate insulating film 38. The selection transistor Tr and the MTJ element 1 are included in a memory cell of an MRAM. The source region 37b is connected to another bit line 42 via a plug 41. The extraction electrode 34 may be omitted, and the plug 35 may be disposed under the lower electrode 33 and directly connected to the lower electrode 33. The bit lines 32 and 42, the electrodes 31 and 33, the extraction electrode 34, and the plugs 35 and 41 contain any of W, Al, AlCu, and Cu.

An MRAM corresponding to the magnetic memory according to the seventh embodiment includes a memory cell array with a plurality of memory cells, each being the one shown in FIG. 17, disposed in rows and columns.

Figure 18:
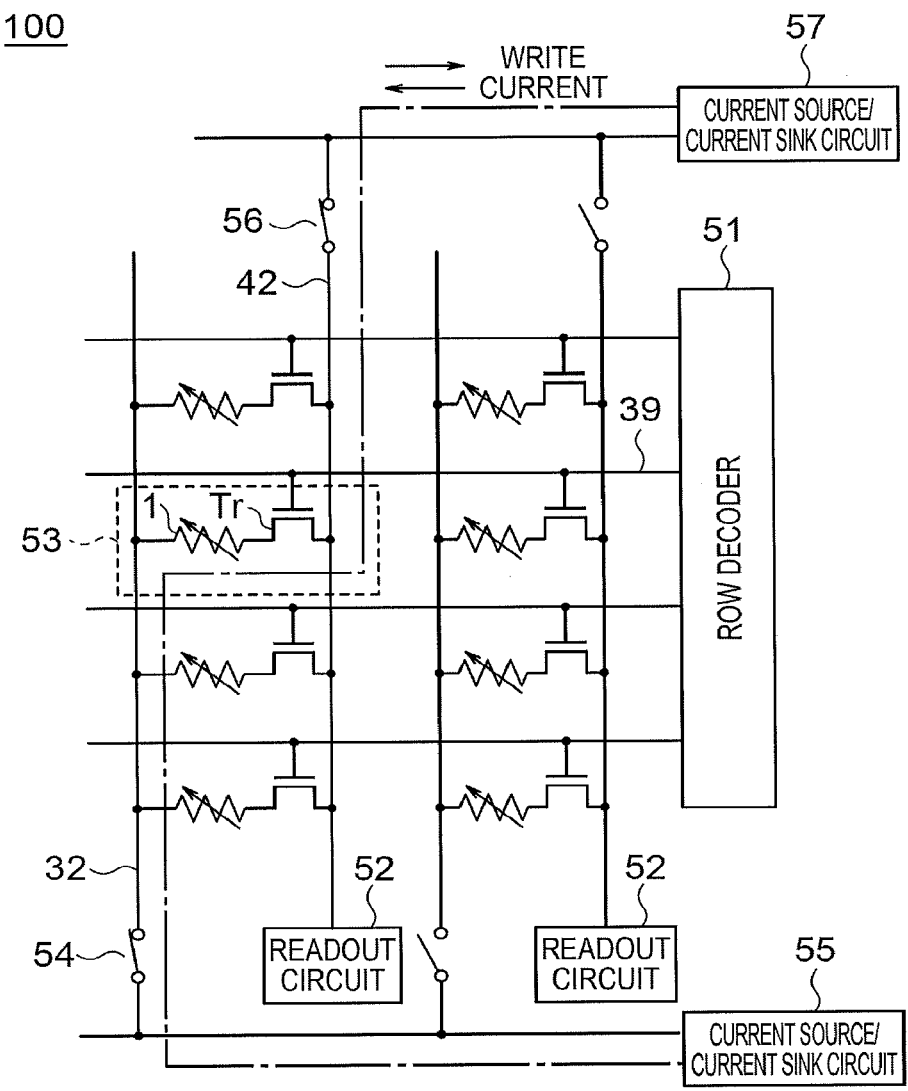
FIG. 18 is a circuit diagram of the magnetic memory according to the seventh embodiment.

FIG. 18 is a circuit diagram of a magnetic memory 100 according to the seventh embodiment. As shown in FIG. 18, memory cells 53 each including an MTJ element 1 and a selection transistor Tr are disposed in a matrix form. A first terminal of each of the memory cells 53 in the same column is connected to the same bit line 32, and a second terminal is connected to the same bit line 42. The gate electrodes (word line) 39 of the selection transistors Tr of the memory cells 53 in the same row are mutually connected, and further connected to a row decoder 51.

The bit line 32 is connected to a current source/current sink circuit 55 via a switch circuit 54 such as a transistor. The bit line 42 is connected to a current source/current sink circuit 57 via a switch circuit 56 such as a transistor. The current source/current sink circuits 55 and 57 supply a write current to the bit lines 32 and 42 connected to them, and extract a current from the bit lines 32 and 42.

The bit line 42 is also connected to a readout circuit 52. The readout circuit 52 may be connected to the bit line 32. The readout circuit 52 includes a read current circuit and a sense amplifier.

In a write operation, a current path passing through a target memory cell is formed by turning on the switch circuits 54 and 56 connected to the target memory cell and the selection transistor Tr. One of the current source/current sink circuits 55 and 57 serves as a current source circuit, and the other serves as a current sink circuit. The roles are determined depending on the information to be written. A write current flows in a direction determined according to the information to be written.

With respect to the write speed, the spin transfer torque writing may be performed with a current having a pulse width of several nanoseconds to several microseconds.

In a read operation, a read current that is satisfactorily low to prevent magnetization switching is supplied from the read current circuit 52 to an MTJ element 1 determined in the same manner as the write operation. The sense amplifier of the readout circuit 52 determines the resistance state of the MR element by comparing, with a reference value, a current value or voltage value derived from the resistance value that depends on the magnetization state of the MTJ element.

The current pulse width in a read operation is preferably narrower than that in a write operation. The occurrence of writing errors caused by a current in a read operation may be reduced in this manner. This is based on the fact that the narrower the pulse width of a write current is, the greater the absolute value of the write current value becomes.

As described above, according to the sixth embodiment, a magnetic memory including a magnetoresistive element with low saturation magnetization, high perpendicular magnetic anisotropy and high MR ratio may be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a first magnetic layer;
a second magnetic layer; and
a first nonmagnetic layer disposed between the first magnetic layer and the second magnetic layer,
the second magnetic layer containing a material with a composition $(IR_{1-x}hR_x)_z(TM_{1-y}Z_y)_{1-z}$ ($0<x<1$, $0 \leq y \leq 0.6$, $0.13 \leq z \leq 0.22$) where IR is at least one element of Y, La, Ce, Pr, Nd, or Sm, hR is at least one element of Eu, Gd, Tb, Dy, Ho, Er, Tm, Yb, or Lu, TM is at least one element of Mn, Fe, Co, or Ni, and Z is at least one element of B, C, Mg, Al, Sc, Ti, Cu, or Zn.

2. The magnetoresistive element according to claim 1, wherein the material includes crystal with a hexagonal structure.

3. The magnetoresistive element according to claim 1, wherein the material has a composition $(IR_{1-x}hR_x)_z(TM_{1-y}Z_y)_{1-z}$ ($0.1 \leq x \leq 0.7$, $0.18 \leq y \leq 0.54$, $0.13 \leq z \leq 0.22$).

4. The magnetoresistive element according to claim 1, wherein the material contains at least Sm as IR, at least Gd as hR, at least Co as TM, and at least Cu as Z.

5. The magnetoresistive element according to claim 1, further comprising a third magnetic layer and a first layer, a magnetization of the third magnetic layer being antiparallel to a magnetization of the second magnetic layer, the second magnetic layer being disposed between the first nonmagnetic layer and the third magnetic layer, and the first layer being disposed between the second magnetic layer and the third magnetic layer.

6. The magnetoresistive element according to claim 1, further comprising a fourth magnetic layer disposed between the first nonmagnetic layer and the second magnetic layer, and having a magnetization that is substantially in a same direction as the magnetization of the second magnetic layer.

7. The magnetoresistive element according to claim 6, further comprising a second layer disposed between the second magnetic layer and the fourth magnetic layer.

8. The magnetoresistive element according to claim 7, wherein the second layer contains at least one element of Mo, Ta, or W, at least one element of Al, Ni, Cu, Rh, Ir, or Pt, or at least one element of Mg, Sc, Co, Zr, Ru, Hf, or Zn.

9. The magnetoresistive element according to claim 1, further comprising a fifth magnetic layer disposed between the first nonmagnetic layer and the second magnetic layer, and a third layer disposed between the fifth magnetic layer and the second magnetic layer, a magnetization direction of the fifth magnetic layer being substantially opposite to a magnetization direction of the second magnetic layer.

10. The magnetoresistive element according to claim 1, further comprising a third magnetic layer disposed between the first nonmagnetic layer and the second magnetic layer, a fourth layer disposed between the second magnetic layer and the third magnetic layer, a fourth magnetic layer, and a second nonmagnetic layer disposed between the second magnetic layer and the fourth magnetic layer, the second magnetic layer being disposed between the fourth layer and the fourth magnetic layer, a magnetization direction of the third magnetic layer being substantially opposite to a magnetization direction of the second magnetic layer, and a magnetization direction of the fourth magnetic layer being substantially the same as the magnetization direction of the second magnetic layer.

11. A magnetic memory comprising:
the magnetoresistive element according to claim 1;
a selection transistor including first and second terminals and gate, the first terminal electrically connected to one of the first magnetic layer and the second magnetic layer;
a first wiring electrically connected to the other of the first magnetic layer and the second magnetic layer;
a second wiring electrically connected to the second terminal of the selection transistor; and
a third wiring electrically connected to the gate of the selection transistor.

12. The magnetic memory according to claim 11, wherein the material includes crystal with a hexagonal structure.

13. The magnetic memory according to claim 11, wherein the material has a composition $(IR_{1-x}hR_x)_z(TM_{1-y}Z_y)_{1-z}$ ($0.1 \leq x \leq 0.7$, $0.18 \leq y \leq 0.54$, $0.13 \leq z \leq 0.22$).

14. The magnetic memory according to claim 11, wherein the material contains at least Sm as IR, at least Gd as hR, at least Co as TM, and at least Cu as Z.

15. The magnetic memory according to claim 11, further comprising a third magnetic layer and a first layer, a magnetization of the third magnetic layer being antiparallel to a magnetization of the second magnetic layer, the second magnetic layer being disposed between the first nonmagnetic layer and the third magnetic layer, and the first layer being disposed between the second magnetic layer and the third magnetic layer.

16. The magnetic memory according to claim 11, further comprising a fourth magnetic layer disposed between the first nonmagnetic layer and the second magnetic layer, and having a magnetization that is substantially in a same direction as the magnetization of the second magnetic layer.

17. The magnetic memory according to claim 16, further comprising a second layer disposed between the second magnetic layer and the fourth magnetic layer.

18. The magnetic memory according to claim 17, wherein the second layer contains at least one element of Mo, Ta, or W, at least one element of Al, Ni, Cu, Rh, Ir, or Pt, or at least one element of Mg, Sc, Co, Zr, Ru, Hf, or Zn.

19. The magnetic memory according to claim 11, further comprising a fifth magnetic layer disposed between the first nonmagnetic layer and the second magnetic layer, and a third layer disposed between the fifth magnetic layer and the second magnetic layer, a magnetization direction of the fifth magnetic layer being substantially opposite to a magnetization direction of the second magnetic layer.

20. The magnetic memory according to claim 11, further comprising a third magnetic layer disposed between the first nonmagnetic layer and the second magnetic layer, a fourth layer disposed between the second magnetic layer and the third magnetic layer, a fourth magnetic layer, and a second nonmagnetic layer disposed between the second magnetic layer and the fourth magnetic layer, the second magnetic layer being disposed between the fourth layer and the fourth magnetic layer, a magnetization direction of the third magnetic layer being substantially opposite to a magnetization direction of the second magnetic layer, and a magnetization direction of the fourth magnetic layer being substantially the same as the magnetization direction of the second magnetic layer.

* * * * *